(12) United States Patent
Letard et al.

(10) Patent No.: US 9,594,264 B2
(45) Date of Patent: Mar. 14, 2017

(54) OPTIMIZED ARRANGEMENT OF TRIAZOLE PARTICLES

(75) Inventors: Jean-François Letard, Canejean (FR); Céline Etrillard, Palaiseau (FR); Bernard Doudin, Strasbourg (FR); Vina Faramarzi, Strasbourg (FR); Jean-François Dayen, Strasbourg (FR)

(73) Assignee: Centre National de la Recherche Scientifique—CNRS-, Paris (FR)

( * ) Notice: Subject to any disclaimer, the term of this patent is extended or adjusted under 35 U.S.C. 154(b) by 44 days.

(21) Appl. No.: 13/983,122

(22) PCT Filed: Feb. 7, 2012

(86) PCT No.: PCT/FR2012/050259
§ 371 (c)(1),
(2), (4) Date: Aug. 1, 2013

(87) PCT Pub. No.: WO2012/107680
PCT Pub. Date: Aug. 16, 2012

(65) Prior Publication Data
US 2013/0306936 A1    Nov. 21, 2013

(30) Foreign Application Priority Data
Feb. 7, 2011   (FR) ..................... 11 50949

(51) Int. Cl.
*H01L 29/06*   (2006.01)
*H01L 21/00*   (2006.01)
(Continued)

(52) U.S. Cl.
CPC ........ *G02F 1/0147* (2013.01); *H01L 51/0595* (2013.01); *H01L 51/4206* (2013.01); *Y02E 10/549* (2013.01); *Y02P 70/521* (2015.11)

(58) Field of Classification Search
CPC ........... H01L 21/02606; H01L 51/0048; H01L 29/0669; H01L 29/413; H01L 51/0045;
(Continued)

(56) References Cited

U.S. PATENT DOCUMENTS 6,200,730 B1    3/2001 Khan et al.
2007/0285148 A1* 12/2007 Sakamoto et al. ............ 327/365
(Continued)

FOREIGN PATENT DOCUMENTS

JP    EP 1355323 A1 * 10/2003 ............. B82Y 10/00

OTHER PUBLICATIONS

Kahn et al., "Spin-Transition Polymers: From Molecular Materials Toward Memory Devices," Science, American Association for the Advancement of Science, Washington, DC, US, vol. 279 (5347), pp. 44-48 (Jan. 2, 1998).
(Continued)

*Primary Examiner* — Julio J Maldonado
*Assistant Examiner* — Moin Rahman
(74) *Attorney, Agent, or Firm* — Drinker Biddle & Reath LLP

(57) ABSTRACT

An electrical device in provided having two electrodes separated from one another, wherein one temperature controlled electronic spin-state transition particle is in direct contact with each of the two electrodes, the particle being of the ionic type and containing a transition metal bearing a cationic charge.

17 Claims, 9 Drawing Sheets

(51) Int. Cl.
*G02F 1/01* (2006.01)
*H01L 51/05* (2006.01)
*H01L 51/42* (2006.01)

(58) Field of Classification Search
CPC .......... H01L 51/057; H01L 2221/1094; H01L 2224/05193; H01L 2224/05293; H01L 2224/05493; H01L 2224/05693
USPC ...... 257/13, 79–103, 918, 40, 642–643, 759
See application file for complete search history.

(56) References Cited

U.S. PATENT DOCUMENTS

| | | | |
|---|---|---|---|
| 2008/0053952 A1* | 3/2008 | Okada et al. | 216/13 |
| 2008/0311401 A1* | 12/2008 | Letard et al. | 428/404 |
| 2009/0152664 A1* | 6/2009 | Klem et al. | 257/440 |
| 2011/0233616 A1* | 9/2011 | Choi | H01L 49/003 257/200 |

OTHER PUBLICATIONS

Shi et al., "Study of molecular spin-crossover complex $Fe(phen)_2(NCS)_2$ thin films," Applied Physics Letters, AIP, American Institute of Physics, Melville, NY, US, vol. 95(4), pp. 43303-43303 (Jul. 29, 2009).

* cited by examiner

FIG. 1
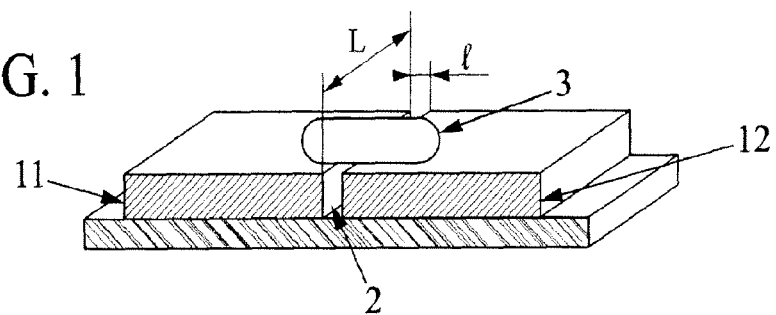
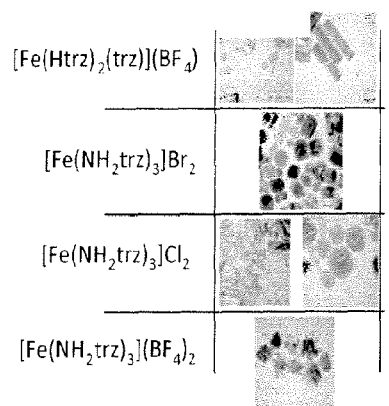
FIG. 2
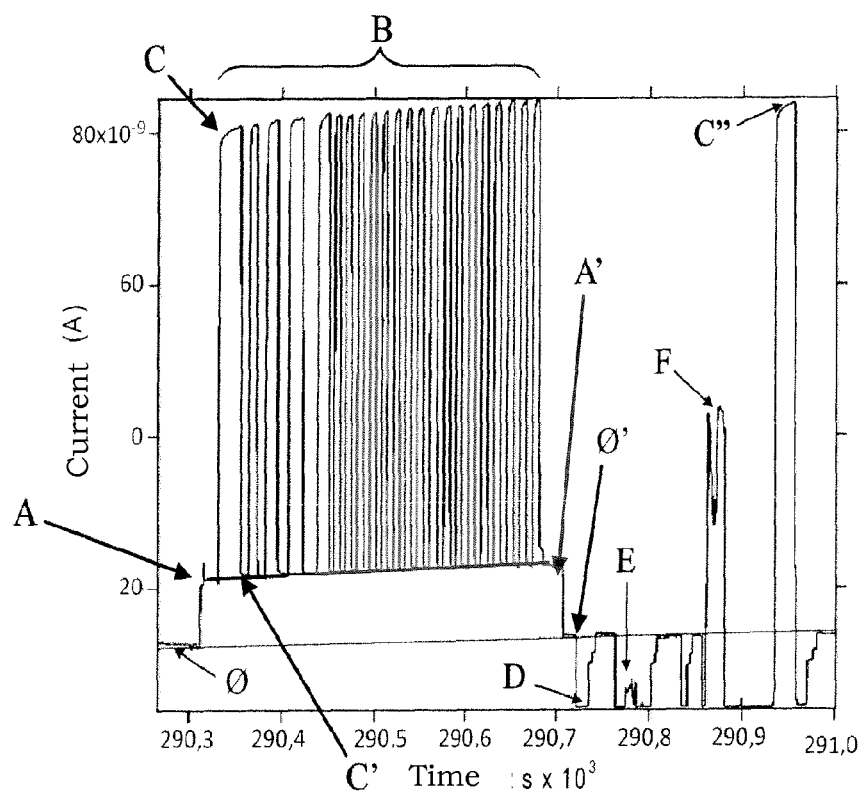
FIG. 3

FIG. 14A
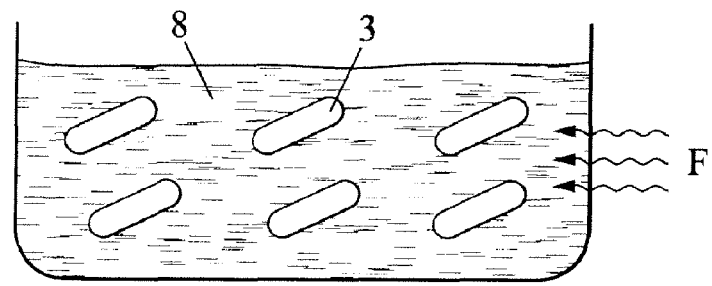
FIG. 14B
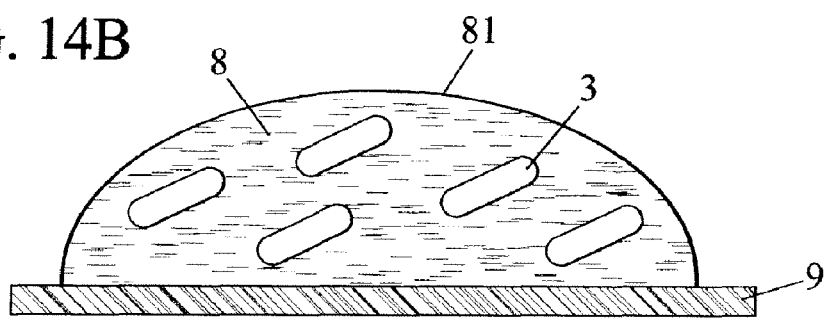
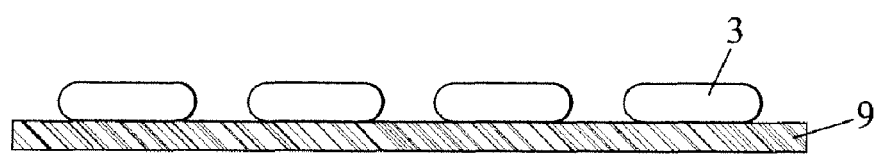
FIG. 14C
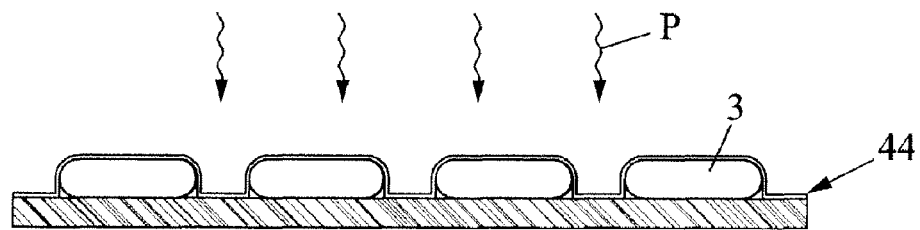
FIG. 14D

OPTIMIZED ARRANGEMENT OF TRIAZOLE PARTICLES

CROSS-REFERENCE TO RELATED APPLICATIONS

This application is the U.S. national phase of the International Patent Application No. PCT/FR2012/050259 filed Feb. 7, 2012, which claims the benefit of French Application No. 11 50949 filed Feb. 7, 2011, the entire content of which is incorporated herein by reference.

FIELD

The invention relates to the field of electronic devices and, in particular, the field of photoconversion and photoelectric devices.

BACKGROUND

In transmission mode, photoconversion is relative to the creation of photons by an electronic device subject to a current or voltage, or, in receiving mode, to the modification of electrical properties in the presence of photons.

In particular, two types of receiving device are often used: photoelectric devices in which a photon modifies resistivity and photovoltaic devices in which photon reception brings about the creation of a current by the device.

The first type of device is useful for forming light-detection sensors or for adapting a process to a given luminosity.

The second type of device can be used either as a light-detection sensor or as a current or voltage generator, for example, to supply current and/or voltage to an electrical network or to another electronic device. Both types of device fall globally into the field of "intelligent" material devices, which interact with external stimuli and have applications in the fields of safety and threshold detection, among others.

Materials known to the state of the art for forming photoelectric devices are generally semiconductor materials. They are, for example, monocrystalline materials such as silicon or gallium arsenide, or polycrystalline silicon or other amorphous materials. To manipulate these materials and fabricate devices, it is generally necessary to employ microelectronic techniques that are costly and difficult to implement.

Other materials exist, such as colorant-based materials. However, this solution uses rare materials such as ruthenium, for example, and requires a nanoparticle foam of titanium dioxide to obtain good yields. Moreover, it is necessary to maintain the colorant in solution in a liquid, which can necessitate the resolution of sealing problems and involves taking precautions in the event of freezing of the liquid solution.

Another known solution is the use of organic materials. These materials are comparatively ineffective compared to other solutions and entail the risk of polymer recrystallization as well as degradation risks when there are variations in temperature.

At present, none of the known solutions is completely satisfactory. Devices having better energy yield or better sensitivity or low design cost are sought after. The world of industry, therefore, is searching for new ways of producing such devices.

SUMMARY

The present invention relates to a device having such photoconductive properties.

To that end, the invention proposes a device whose properties vary as a function of luminosity. In particular, the invention involves an electrical device having two electrodes separated from one another, wherein at least one temperature controlled electronic spin-state transition particle is in direct contact with each of the two electrodes. The particle is chosen as being of the ionic type and having a transition metal that bears a cationic charge.

In this way, the particle in contact with the two electrodes has, in darkness, a conductivity comparable to that of a semiconductor material.

Because the particle has a temperature controlled electronic spin-state transition, below a transition temperature, the particle is preferably in a first electronic spin state between the high electronic spin state and the low electronic spin state and, above this transition temperature, the particle is preferably in the other of the two electronic spin states. In particular, in a preferred case, below a transition temperature, the particle is in the low electronic spin state and, above this transition temperature, the particle is in the high electronic spin state. The transition temperature can have different values depending on whether the transition occurs by increasing the temperature of by decreasing the temperature.

The device, therefore, can be used to connect two electrodes with a particle that is potentially sensitive to a change of electronic spin state, which is favorable for an interaction with photons.

The conductivity of the particle varies as a function of the intensity of incident light and, consequently, the device has at least one electrical property that varies as a function of light intensity.

Although the discussion refers only to a single particle, it is clear that the invention also relates to devices having several particles in direct simultaneous contact with the two electrodes.

Preferably, the particle is based on a compound that complies with the formula:

wherein R-Trz is a ligand, 1,2,4-triazole with a substituent, R, on the nitrogen of position 4; X represents at least one anion; and n is calculated in such a way that the electroneutrality of the formula is respected.

The substituent R is advantageously chosen from among the group composed of hydrogen and $H_2N—$, $R_1—$, $HR_1N—$, and $R_1R_2N—$ compounds, where $R_1$ and $R_2$ are alkyl radicals. It should be noted that, in some cases, triazole ligands may not have an R substituent and, therefore, form an anion, known as a triazolato. If certain triazole ligands in the particle are replaced by an anionic triazolato ligand, this could apply, for example, to each of the compounds contained in the particle (FIG. 2) or to only some of those compounds.

Those particles, for example, in the form of aggregates of compounds consisting primarily of the aforementioned formula, are examples of particles having a temperature-controlled electronic spin-state transition.

Preferably, the particle is a nanometric particle wherein at least one dimension is nanometric, comprised between 700 nm and 30 nm or 10 nm or less than 5 nm. In this way it is possible to propose a device having a high density of integration.

In certain embodiments of the device according to the invention, the particle is covered dissymmetrically with a layer of metal. The metal layer may provide optical, magnetic, electrical, or chemical properties to the particle, which can modify the photoelectric properties of the device, for example, by modifying the absorption of certain wavelengths or by modifying the electrical contact between the particle and one or both of the electrodes. Additionally, if the metal layer is magnetic or magnetizable, nickel, for example, it can be useful for positioning the particles near the trench according to an embodiment of the method of invention described below. It can be seen, therefore, that a particle partially covered with magnetic or magnetizable metal is reflective of the implementation of the fabrication process.

In a particular embodiment, the device according to the invention is suitable for functioning as a photoconductive device. For this, in a preferred embodiment, the two electrodes are covered with the same metal. The electrodes then have surfaces of an identical metal, which facilitates obtaining, for each particle, operating features that are appreciably identical for each of the two electrodes.

In another particular embodiment, the device according to the invention is suitable for functioning as a photovoltaic device. For this, in a preferred embodiment, one of the two electrodes is covered with a first metal and the other of the two electrodes is covered with a second metal, different from the first metal. The particle is then in contact with surfaces of a different metal for each electrode, which facilitates obtaining, for each particle, operating features that are different for each of the two electrodes. This difference in operating features provides photovoltaic properties to the device according to the invention. The particle, connected to the electrodes, then produces a voltage that depends on the intensity of incident light.

What applies to the particle applies to the surfaces of the electrodes; the metal is preferably chosen from among elements in the list consisting of gold, nickel, and a multilayer gold-nickel structure. In effect, gold is known for its chemical neutrality and its properties of electrical conductivity, and nickel can provide magnetic properties to the particle or to the electrodes. Aluminum, ruthenium, or other metals can also be used. A multilayer structure can be used to provide a feature characteristic of a first metal, nickel for example, to the particle and/or to the electrodes, while having a surface of a second metal, gold for example. In this way, we can create a particle that, while having a magnetic function generated by the nickel, does not necessarily react chemically through its metal layer, or we can create a nickel electrode whose surface is gold.

Preferably, the electrodes are separated by a trench imposing a distance that is less than or appreciably equal to 100 nanometers between the two electrodes. In this way it is possible to create a device having a high density of integration. Additionally, this dimension is generally smaller than the dimensions of the particles.

The electrodes are separated by a trench and are opposite one another over a linear distance that can be comprised between a few micrometers and a few meters. In this way it is possible to modulate the density of integration of the device and adjust the linear distance to the number of particles present that are in direct simultaneous contact with the two electrodes.

The heights of the two electrodes, defined as being perpendicular to a principal plane shared by the two electrodes, can be advantageously different from one another. This difference in height makes the use of a variety of electrical contacts between the particle and the electrodes possible.

The device according to the invention, suitable for functioning as a photoelectric device and suitable for changing photoelectric properties based on a predetermined temperature, can advantageously be such that electronic spin-state transition particles are chosen from among temperature controlled electronic spin-state transition particles whose spin transition takes places near the specified temperature. The temperature controlled electronic spin-state transition can be used to modify the properties of the particle. In certain advantageous cases, this modification of properties brings about a modification of optical or electrical properties. For example, it is possible that the electronic spin-state transition brings about a modification of light absorption. It is, therefore, possible to provide a device whose photoelectric property changes whenever a given temperature is reached. This can be useful if we want to use temperature for control or to limit the aging of the device whenever the temperature becomes too high.

The invention also relates to a manufacturing process for a device according to the invention. The said process advantageously consists of the following successive steps:
a) the supply of two metallic electrodes on a substrate, separated from one another by a trench;
b) deposition of at least one temperature controlled electronic spin-state transition particle in such a way that it is in direct simultaneous contact with the two electrodes.

Deposition of a particle preferably occurs in the form of the localized application of a liquid solution containing the particle in ionic solution. Then, evaporation of the liquid solution advantageously takes place to leave the particle on the device with removal of the liquid solution. The particle being of an ionic type having a transition metal that bears a cationic charge, the electroneutrality of the liquid phase is provided by an anionic counter-ion. The deposit, in the form of a liquid solution, has the advantage of making it possible to deposit a particle on the electrodes in localized manner without its deterioration. Evaporation of the liquid solution is an effective means of leaving only particles and counter-ions on the surface of the electrodes.

It should be noted that step b) can be replaced by another particle formation step, for example, one involving growth on the electrodes.

The process according to the invention can involve, following step b), the application of a voltage between the two electrodes. The applied voltage is sufficiently high to reduce the access resistance between the electrodes and the particle but sufficiently low not to destroy the particle or the trench separating the electrodes. This results in voltage bonding. The electrical contact between the particle and either or both of the two electrodes is improved so as to obtain improved conductance in the device.

The applied voltage is advantageously comprised between 0.5 volts and 5 volts. This voltage range is generally sufficiently high to reduce the access resistance between the electrodes and the particle but sufficiently low not to destroy the particle or the trench separating the electrodes.

According to another advantageous method for realizing a device according to the invention, wherein the electrodes have at least one magnetizable metal, we advantageously incorporate, prior to step b):
  a step during which the particle to be deposited in step b) is partially covered with a layer of metal having magnetic properties;
  and a step involving magnetization of the electrodes by means of the application of a magnetic field at the two electrodes.

Additionally, step b) preferably includes, between deposition of the liquid solution and its evaporation, a step involving organization of the particles near the trench separating the electrodes by means of the application of a magnetic field at the two electrodes.

The steps of magnetization and organization create, through the application of the magnetic field, a magnetic field gradient at the trench separating the two electrodes. The particle is in the drop of liquid solution and can thus be moved freely. Because it has been previously metalized by a layer of metal having magnetic properties, it is preferentially attracted by the magnetic field gradient. The particle thus positions itself near the trench, which increases the chances that, after evaporation of the liquid solution, the particle will be in direct simultaneous contact with the two electrodes.

Advantageously, the particle organization step can be used, by preferentially attracting particles at the trench, to increase the density of particles present at the trench compared to a method without an organization step.

BRIEF DESCRIPTION OF THE DRAWINGS

Other characteristics and advantages of the invention will become apparent upon examination of the detailed description below and the attached drawings, wherein:

FIG. 1 represents, schematically, a device according to the invention having a particle in direct simultaneous contact with two electrodes;

FIG. 2 is a table representing certain formulas of the compound that can be used in a device according to the invention as well as possible shapes of the particles based on those compounds;

FIG. 3 is a diagram illustrating the conductance of a device according to the invention as a function of time whenever the intensity of incident light is varied;

FIGS. 14A to 14E illustrate schematically a method for partially metalizing particles for a device according to the invention;

FIGS. 16C' and 16D' illustrate a variant of the step of the method according to the invention in which the particles are positioned near the trench;

DETAILED DESCRIPTION

Figure 4:
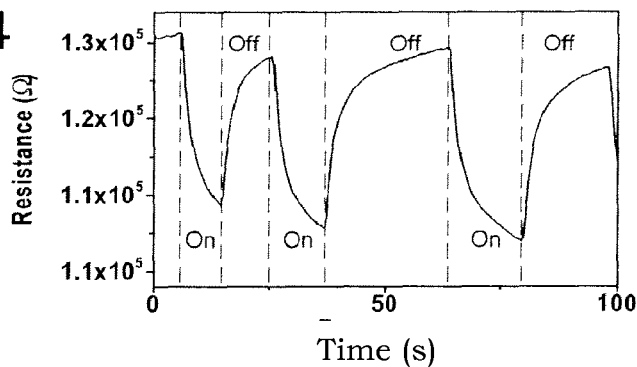
FIG. 4 is a diagram representing the resistance of a gold film as a function of time whenever the intensity of incident light is varied.

We refer first to FIG. 1 in which a device according to the invention is represented schematically. Electrical device 1 according to the invention has two electrodes 11 and 12, separated from one another by trench 2. At least one temperature controlled electronic spin-state transition particle 3, referred to as a "particle" in the remainder of the description, is in direct simultaneous contact with the two electrodes 11, 12. Such a particle will subsequently be referred to as an "active particle." The term "particle" shall refer to any particle for which we can control an electronic spin-state transition by varying the temperature, independently of the device, while the term "active particle" shall refer to any particle in direct simultaneous contact with the two electrodes. Preferably, several active particles are provided in devices according to the invention. But it is possible for there to be only a single active particle.

Particles 3 are ionic, which means that particles 3 consist of chains of molecules that include transition metals bearing a positive ionic charge. Counter-ions can be used to form an ionic compound whose electroneutrality is respected by supplying a negative ionic charge. Particles 3 can be coordination polymers.

In a preferred case, particles 3 have at least one nanometric dimension, that is to say, less than one micrometer and, for example, greater than 1 nm or 5 nm or 10 nm. An advantageous example is the use of particles 3 whose dimensions are comprised between 30 nanometers (nm) and 700 nm.

Electrodes 11, 12 are conductive and separated by trench 2. Preferably, the two electrodes 11, 12 are separated from one another by a distance that is appreciably constant, hereinafter referred to as "width 1" of trench 2.

Preferably, width 1 of trench 2 has a value less than a dimension of said particles 3. Typically, width 1 of the trench can have a value that is much less than two dimensions of particles 3. For example, this value can be smaller by a factor of 2, 3 or more, than two dimensions of particles 3. Thus, in a particular case, trench 2 separating the two electrodes 11, 12 can have a width 1 comprised between 50 nm and 500 nm, or between 70 nm and 100 nm. It can be seen that the width of trench 2 can be adapted to the dimensions of particles 3 intended for use or, conversely, the dimensions of the particles can be based on the width of trench 2.

We define as the linear distance, L, of trench 2 a distance over which the two electrodes 11, 12 are opposite one another and appreciably separated by width 1. We also define the heights h11 and h12, respectively, at the two referenced electrodes, 11 and 12, as measured perpendicularly to width 1 and to linear distance L.

The linear distance L of trench 2 can have a size that is adapted to the number of particles 3 we wish to see in the device and to the dimensions of particles 3. In particular, linear distance L can measure a few tens of micrometers to a few meters if trench 2 is sinuous, for example, if electrodes 11, 12 assume the shape of interdigited patterns or if trench 2 has a serpentine shape. Conversely, it is possible to have a trench 2 wherein linear distance L is such that one particle 3 at a time can connect the two electrodes 11, 12. The shape of particles 3 can vary. The particles can be roughly spherical, cylindrical, parallelepipedic, or of unspecified shape. FIG. 2 illustrates possible shapes of particles 3 that can be envisaged for realizing the invention.

The particles 3 used are preferably temperature controlled electronic spin-state transition particles based on a compound satisfying the following chemical formula {1}:

[Fe(G)$_3$](X)$_n$          chemical formula {1}:

where G is a 1,2,4-triazole ligand with a substituent, R, on the nitrogen in position 4, indicated as R-Trz.

Substituent R can be chosen from among the group composed of hydrogen and $H_2N-$, $R_1-$, $HR_1N-$, and $R_1R_2N-$ compounds, where $R_1$ and $R_2$ are alkyl radicals.

X represents at least one anion; and n is calculated in such a way that the electroneutrality of the formula is respected.

It is clearly understood that for a given compound, element (G)$_3$ is preferably such that the three ligands G are identical, but alternatively, one of ligands G can carry a substituent that differs from the other ligands G. In another alternative, the three ligands can have different substituents.

It should be noted that, in addition to the compound complying with chemical formula {1}, it can be worthwhile, in terms of the invention, to replace some percentage of the iron atoms with another transition metal, for example, zinc, chromium, ruthenium, or another transition metal, so as to modify the photoelectric properties of the device or provide other properties. Similarly, it can be worthwhile to replace some percentage of ligands G of the particle with ligands G', which have a substituent R' having some other functionality. The functionality provided by substituent R' can be, for example, a chromatophoric or fluorophoric functionality, or a functionality that facilitates adhesion or repulsion with the selected radicals. Alternatively, ligands G' can be anionic 1,2,4-triazolato ligands, indicated as Trz, which do not carry a substituent. Finally, it is possible to replace some percentage of anions X with anions Y, which have an additional property, for example, a chromatophoric or fluorophoric property, or a luminescent property.

These variations of the particle around the compound, complying strictly with chemical formula {1}, do not fundamentally alter the properties of the particle obtained. Replacement of a small percentage, for example, less than 50% or 10% or 5% or 1%, or even a few thousandths, of one or more elements of chemical formula {1} with one or more of the aforementioned replacement elements leads to the formation of particles having the same type of electrical or photoelectric property as those presented below in this description. The percentage of compounds complying with chemical formula {1} that can be replaced by a variant of this compound depends on the type of variation under consideration. In particular, replacement of the iron atom, present in the center of the compound, with another metal is advantageously limited to a few thousandths or hundredths of the compounds forming the particle, for example, less than 5 percent or less than 5 thousandths of the compounds. A variation of one or more substituents R or counter-ions can be of the same order of magnitude if the substituents or counter-ions are of significant dimension relative to the original substituents or counter-ions. On the other hand, if we replace a triazole ligand with an anionic triazolato ligand, it can be beneficial to introduce the variation to appreciably all the compounds making up the particle for one or two ligands G per compound.

Thus, the invention covers different devices having particles presenting the variations discussed above in addition to a compound complying strictly with chemical formula {1}.

The table in FIG. 2 shows several particles that can be used to realize a device according to the invention, their chemical formula, their general shape, the average sizes obtained, and temperatures $T_{1/2up}$ and $T_{1/2down}$, which correspond to temperatures that cause a transition of the electronic spin state in the particles. The electronic spin-state transition can display a hysteresis cycle, that is, an electronic spin-state transition modifying the spin in one direction may require a higher or lower temperature than the opposite spin transition. We can refer to the single FIGURE in patent application EP 0842988 to visualize an example of a hysteresis cycle for the electronic spin-state transition for a particle of a type that can be used to form a device according to the invention.

Particles of the formula [Fe(H-Trz)$_2$Trz](BF$_4$) can assume a cubic or parallelepipedic form, with dimensions comprised between approximately 70 nm by 70 nm by 40 nm and 70 nm by 700 nm by 200 nm, and temperatures $T_{1/2up}$ and $T_{1/2down}$, respectively in the vicinity of 380K and 360K. These particles illustrate a particular case where a triazole ligand has been replaced with an anionic triazolato ligand in the vast majority of compounds making up the particles.

Particles of the formula [Fe(NH$_2$-Trz)$_3$]Br$_2$ can assume an appreciably cubic form per side, comprised between 70 nm and 150 nm, and temperatures $T_{1/2up}$ and $T_{1/2down}$, respectively in the vicinity of 315K and 305K.

Particles of the formula [Fe(NH$_2$-Trz)$_3$]Cl$_2$ can assume an appreciably disc-like or cylindrical or parallelepipedic shape, with dimensions that can be approximately 140 nm by 40 nm or 100 nm by 150 nm in diameter for the cylinders and temperatures $T_{1/2up}$ and $T_{1/2down}$ in the vicinity of 340K and 330K, respectively.

Finally, we note the mention of particles of the formula [Fe(NH$_2$-Trz)$_3$](BF$_4$)$_2$, of unspecified shape, with dimensions near 100 nm up to 150 nm and temperatures $T_{1/2up}$ and $T_{1/2down}$ in the vicinity of 225K and 220K, respectively.

Thus, the variations of chemical formula {1}, mentioned above, can be used to add functionalities to the particles or to cause the temperature of their electronic spin-state transition to vary, or to facilitate the synthesis of particles of a given dimension without endangering either the existence of a temperature controlled electronic spin-state transition or the photoelectric properties illustrated in greater detail below.

The device according to the invention exhibits a variation in its electrical properties as a function of the brightness of the incident light. In this way it is possible to use the device as a photosensitive electrical device.

The devices according to the invention can exhibit an intrinsic conductivity, in darkness, greater than 0.1 $Sm^{-1}$. This value has been obtained by comparing measured values of conductance of a device according to the invention to a trench width. The device according to the invention is, thus, an electrical device, even in darkness, with an intrinsic conductivity on the order of that of a semiconductor material. We can then use the device according to the invention in the same way as a standard electrical device or semiconductor by imposing an appreciably constant incident light intensity, for example, darkness, or as a photosensitive electrical device or one controlled by light.

According to a first embodiment of the invention, which will be described in greater detail below, the particle has an appreciably identical work function for each electrode and the device according to the invention is a photoconductor device. Thus, the conductance of particles varies when the imposed light intensity varies.

FIG. 3 illustrates the results of tests carried out to evaluate the photoconductive performance of a device according to this embodiment of the invention with time (in thousands of seconds) along the abscissa and current (in amps) across the device when a constant voltage is applied, along the ordinate. Thus, an indication of the passage of a significant current implies the presence of significant conductance. Starting from the time origin, several events can be noted: we observe a current plateau 0, revealing a conductance in the absence of any particular light stimulus. A first event A represents the active use of a microscope, enabling us to focus light on the device. The microscope has internal illumination and we observe a current increase close to a factor of two. We then impose upon the device a B cycle with alternating illuminations, event C, and extinctions, event C', of a halogen lamp, which significantly varies the light intensity incident upon the device. To each illumination C of the halogen lamp there corresponds a sudden increase in the current crossing the device. This reflects a significant increase in the conductance of the device and, in particular, of the particles. Conversely, each extinction C' of the halogen lamp corresponds to a reverse current across the device at the level observed during event A.

At point A' the microscope's internal light was shut off, then, at 0', the light in the room where the tests took place was turned off. Near total darkness is created during event D. Only a very small current circulates in the device.

Then, by bringing the screen of a mobile telecommunications device such as a portable phone near, which has low light intensity, event E is produced and a non-zero current is measured. Thus, with no optimization, a prototype of the device according to the invention detects the low luminosity emitted by a mobile telecommunications device.

Finally, a portable ultraviolet lamp, of the kind frequently found in laboratories, is brought near (event F). The halogen lamp is then turned on (event C''). We observe, respectively, a current increase of a factor of 4, then of a factor of 2 with respect to the situation where the light in the room is on (event 0). The photoconducting device, obtained with the first embodiment of the invention, presents a variation in conductance over a broad range in response to a change in incident light.

In the experimental set-up described above, the light beam of the halogen lamp is focused by the microscope. Using a temperature probe, it was found that the light intensity present at the focal point of the microscope heats the probe until it reaches a temperature near 100° C. The probe presents known heat transfer and absorption properties. These properties are not identical and do not have the same values for the particles used in the invention. However, it is believed that the temperature of the particles is 100° C. due to the influence of the intensity of the light focused by the halogen lamp.

FIG. 4 shows the resistance values of a gold film as a function of the time measured when a halogen lamp whose light is focused on the surface of the gold film is turned on or off. We observe a greater than 20-second delay in the response. When the light is lit, the measured resistance decreases for a few tens of seconds before it begins to stabilize. Similarly, when the light is turned off, we must wait a few tens of seconds before the resistance increases to a level close to the initial level. We measure, respectively, response delays of at least 10, 12, and 15 seconds during various illuminations and 10, 20, and 15 seconds during various extinctions.

For gold, these response delays are representative of a change in the temperature of the film. Thus, for gold (one of the materials with the greatest heat conduction), turning the light on or off does not lead to an instantaneous change in the temperature of the film. Heating and cooling time have an influence on the change in the resistance of the film.

The particles of the device according to the invention have lower heat conductivity than gold. Consequently, if the variation in conductance observed in FIG. 3 was principally associated with a variation in temperature, we should observe a delay in response greater than or at least equal to that of gold. Because response time is faster for the device according to the invention (one to five seconds), this means that the variation in conductance shown in FIG. 3 is illustrative of the photoconductive properties of the device according to the invention. Such a delay in response represents a rapid response time for a photovoltaic or photoconductive device.

Figure 5A:
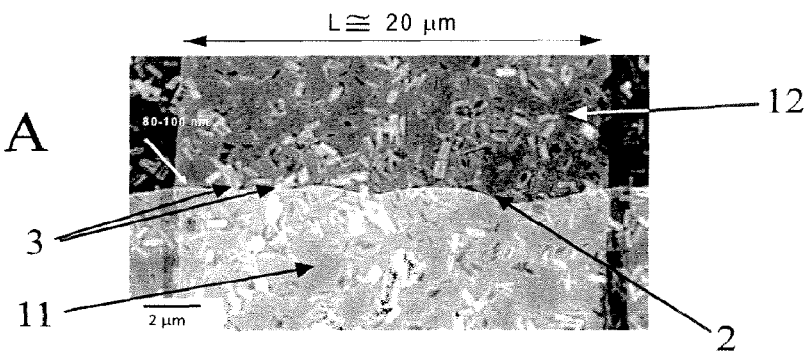
FIGS. 5A and 5B are photographs obtained with a scanning electron microscope of a device according to the invention.
Figure 5B:
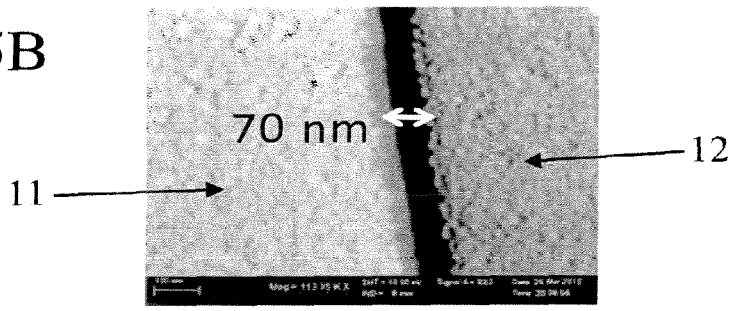

In general, the particles can be randomly present on the surface of the electrodes and only some particles are simultaneously in direct contact with the two electrodes. FIG. 5A is a photograph obtained with a scanning electron microscope of a zone of the device according to the invention, having two electrodes 11, 12, separated by trench 2, and in which numerous particles 3 are present on the surface of the electrodes. Trench 2 is 70 nm wide, as illustrated in FIG. 5B, and has a linear distance close to 20 micrometers. In this example, we see approximately 30 active particles that enable the device according to the invention to function.

Figure 6:
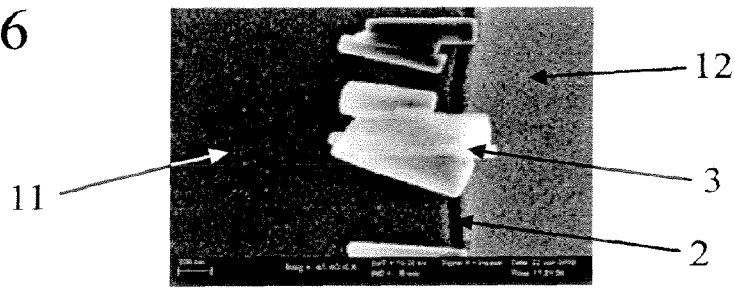
FIG. 6 is a photograph obtained with a scanning electron microscope of a device according to the invention in which the particles are ordered near the trench.

However, in a preferred embodiment of the invention, the particles can be positioned nearly uniquely at the trench separating the two electrodes. A detail of this preferred embodiment of the device is shown in FIG. 6. We see a photograph, obtained by scanning electron microscopy, of a zone of the device according to the invention having two electrodes 11, 12, separated by nanometric trench 2, and having five particles 3, all of which are in simultaneous contact with the two electrodes 11, 12, with a particle density at the trench that is greater than in the previously described embodiment. This preferred embodiment of the invention can be obtained by means of a variant of the method according to the invention, which will be described below.

Figure 7:
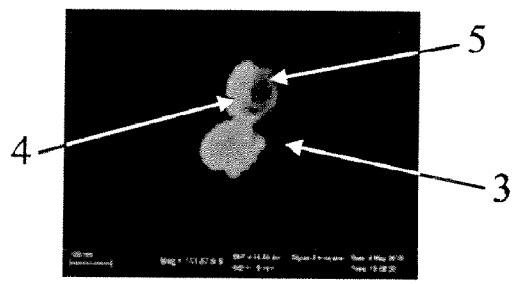
FIG. 7 is a photograph obtained with a scanning electron microscope of a partially metalized particle.

In some embodiments of the invention, some of the particles used are partially covered with metal, a metal film for example. FIG. 7 is a photograph obtained with a scanning electron microscope of such a particle 3. We observe a particle 3 with a lighter metalized zone 4 and a darker non-metalized zone 5. Metalized zone 4 can preferentially be in contact with at least one electrode or, alternatively, non-metalized zone 5 can preferentially be in contact with the electrodes.

The metalized zone can be gold, nickel, or a multilayer gold-nickel structure. However, we can replace gold with another metal, in particular, another metal of the same group—silver, copper, and so on—or with other metals or their alloys. Likewise, we can replace nickel with another metal, for example, with another metal or metal alloy having magnetic properties, such as iron, or with another metal such as ruthenium. Alternatively, the metal can be replaced with a material having specific optical or semiconducting or insulating properties, such as silicon or an oxide.

In a first particular embodiment of the invention, illustrated in FIG. 1, active particle 3, in simultaneous direct contact with the two electrodes 11, 12, is in appreciably identical electrical contact with the two electrodes. The photoelectric device according to the invention then has an appreciably identical work function for each electrode and the device behaves like a photoconductor, as shown in FIG. 3. Thus, a device in which conductance alone varies with the incident light on the device can be obtained by implementing the first particular embodiment of the invention.

To enable this appreciably identical contact with the two electrodes, 11, 12, it is preferable that at least the surfaces of the two electrodes 11, 12 are of the same metal.

In a second particular embodiment of the invention, a dissymmetry is deliberately introduced between the electrical contact of the particle with one of the two electrodes and the electrical contact of the particle with the other of the two electrodes. This creates a dissymmetry between the work functions of the two electrodes, and such a device according to the second particular embodiment of the invention possesses photovoltaic properties.

Thus, when the device is illuminated by a given light source, it produces a voltage response at its terminals, even in the absence of the arrival of an external current to the device. The voltage depends on the brightness of the light beam incident on the device from the light source.

The device can present this property using two arrangements. A first arrangement consists in employing a device in which one of the particles makes electrical contact with an electrode such that its access resistance is lower by a factor of 10 to 1,000 with respect to the other electrode. Below we will present an advantageous step in the method known as "voltage bonding," which is intended to reduce the lower access resistance between the particle and the electrodes. For some devices, the voltage bonding step reduces the access resistance of active particles for only one of the two electrodes. Thus, for these devices, the voltage bonding step functions nonsymmetrically. The particle(s) then have a "dissymmetric bond" with the two electrodes. The device is then a photovoltaic device.

The dissymmetry is thus obtained in the absence of any macroscopic structural dissymmetry. This dissymmetric bonding, which is reflected in a lower access resistance on one electrode rather than the other, can be interpreted by possible differences in atomic structure at the contacts between the particle and the electrodes. Observation of photovoltaic behavior in a device according to the invention that does not present any macroscopic structural dissymmetry reveals a dissymmetry in the work function obtained as described above.

Such photovoltaic devices are obtained randomly, with approximately a ten to thirty percent chance, during fabrication of photoconductive devices according to the invention. It is, therefore, preferable to test each device to determine which devices have photovoltaic properties and which are uniquely photoconductive devices. However, these photovoltaic devices are obtained without complicating the structure or method of fabrication with respect to the photoconductive devices presented above.

Figure 8:
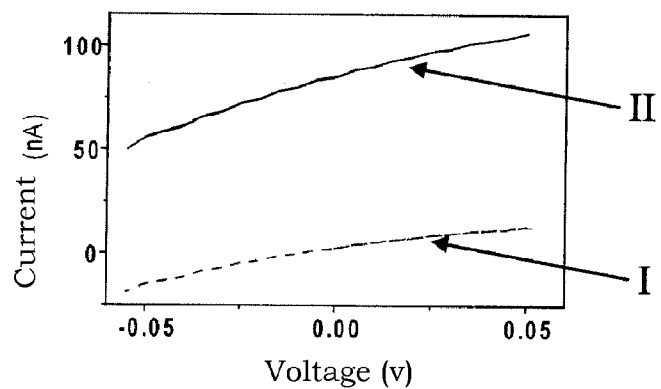
FIG. 8 is a diagram I of V representing the photovoltaic properties of an embodiment of a device according to the invention.

A prototype of a device according to this second particular embodiment of the invention was tested and the results of its operation are shown in FIG. 8, displayed as I-V curves (current as a function of voltage measured at the device terminals). A first measurement was made in the absence of light in the room (curve I) and an I-V curve, crossing the zero amp, zero volt origin point was observed. A second current measurement, this time obtained while illuminating the device with a light from a halogen lamp that was focused on the device is shown in curve II. This curve does not pass through the zero amp, zero volt origin point and shows the generation of a current that can reach approximately 100 nA for certain voltage values. The generation of current through the photovoltaic effect is, in particular, illustrated by the generation of a current close to 75 nanoamperes with an applied voltage of zero volts.

Because the particles used for this experiment have a thickness close to 200 nm, and because the trench is approximately 100 nm wide and extends over a linear distance of 5 microns, we can estimate that the measured current corresponds to a current density close to $8.10^4$ A·m$^{-2}$. Because a particle deposition technique, described below, that results in the random deposition of particles on the surface of the electrodes was used, the number and density of active particles are insufficient. The dissymmetry of the electrical contacts is obtained in the particles by dissymmetric bonding, which is also a random process. Thus, in a preferred embodiment, the device can be optimized to obtain greater photogeneration.

A second arrangement, so that the device according to the invention has photovoltaic properties, consists in the use of a device wherein the contact of the electrodes with the particles uses a different metal in both electrodes. For example, the surfaces of the two electrodes 11, 12 can be of different metals. A "construction" dissymmetry of the work functions can then be imposed.

Figure 9A:
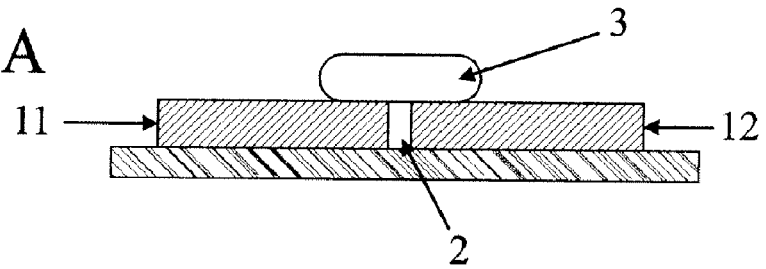
FIGS. 9A and 9B represent schematically two variants of the device according to the invention.

Each electrode can be formed from a unique metal, as shown in FIG. 9A. This metal can be different from one electrode to the other or not, depending on the particular embodiment of the invention employed.

Figure 9B:
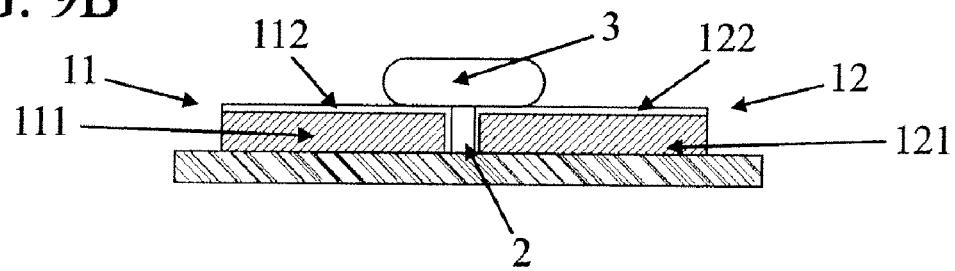

Alternatively, as shown in FIG. 9B, each of the two electrodes has an electrode core 111, 112 of a given metal. The metal used for electrode core 111, 112 can be identical or different for the two electrodes 11, 12. The metal of electrode core 111, 112 can be chosen to provide another functionality to the device. Moreover, each of electrodes 11, 12 is covered, at least where particles 3 are in contact with electrodes 11, 12, with a metallic surface layer 112, 122. The metal surface layers 112, 122 of the two electrodes can be of the same metal. Alternatively, one of the two metal surface layers 112, 122 is of a first metal and the other of the two metal surface layers is of a second metal, different from the first metal, depending on the particular embodiment of the invention employed.

Either or both of the two metallic surface layers 112, 122 can be of the same metal as electrode core 111, 121 on which they are respectively found.

The metallic surface layers 112, 122 of the electrodes can be of solid metal, such as, for example, silver, gold, copper, nickel, aluminum, and so on. The tests carried out and illustrated in FIGS. 3 and 8 were conducted with electrodes with a gold surface or with a multilayer gold and nickel structure. We can also obtain a photovoltaic device according to a second particular embodiment of the invention using two electrodes, one of which has a metallic surface layer 112 of gold and the other a metallic surface layer 122 of aluminum.

According to the present invention, a preferred embodiment consists, independently of the nature of the surface of the electrodes, in using electrode cores of a magnetic or magnetizable material. In particular, this can be nickel or some other magnetic or magnetizable metal or metal alloy.

Figure 10:
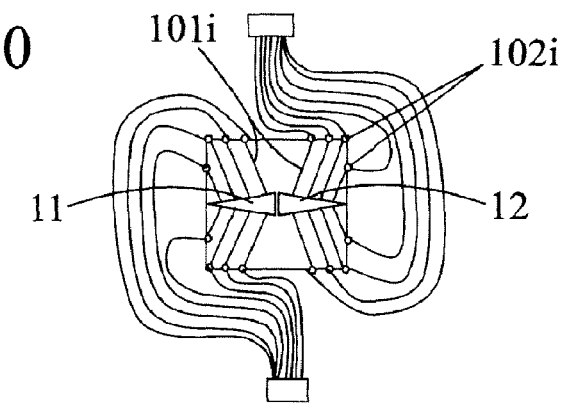
FIG. 10 represents schematically a test device used to evaluate the performance of the device according to the invention.

FIG. 10 is a schematic view of a test bench used to measure the performance of photoelectric devices according to the different embodiments of the invention. We observe a prototype of the device according to the invention 1, having two electrodes 11, 12 connected by tabs 101i to contacts 102i present on the test bench. We also observe wires connecting the contacts to external current feeds.

The device according to the invention can be realized with a single active particle or with several active particles per device.

Likewise, the particles presented in this description are primarily particles of nanometric size, for example, comprised between 30 nm and 700 nm, but the device according to the invention can be realized with larger size particles. As a result, the invention is not limited to particles of nanometric size.

The invention also relates to a method for realizing devices according to the invention. A general description of the method of fabricating devices according to the invention is illustrated in FIGS. 11A to 11C.

Figure 11A:
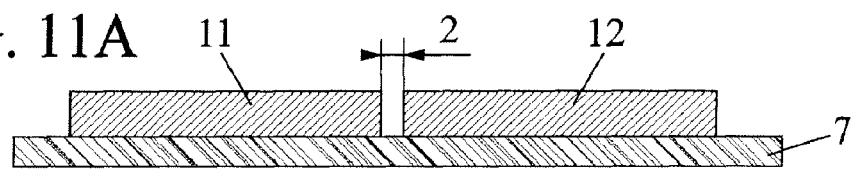
FIGS. 11A to 11C illustrate schematically a method according to the invention.

First, a substrate 7 is supplied having two electrodes 11, 12 separated by trench 2 on its surface (FIG. 11A).

Figure 11B:
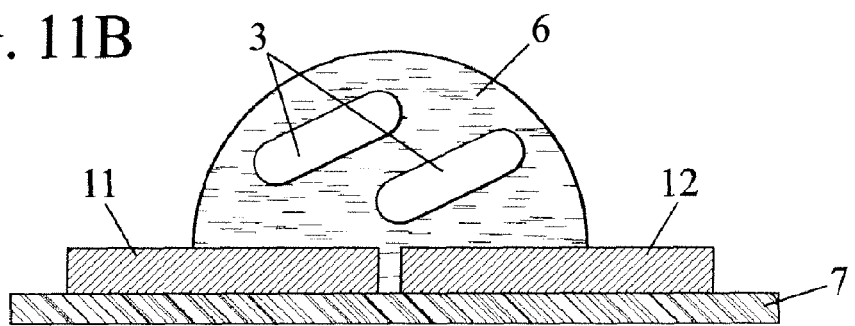
Figure 11C:
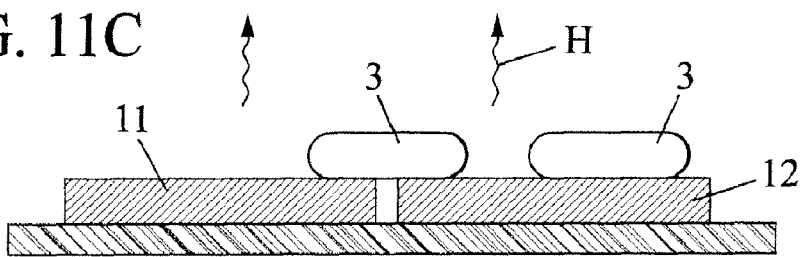

Particles 3 are then deposited on the device at trench 2 (FIG. 11B). Particles 3 are preferably in suspension in a liquid solution. The liquid solution containing particles 3 is then deposited, for example in the form of a localized application of drop 6 on the device, at trench 2.

The liquid solution is then evaporated (FIG. 11C), for example, by means of a heat treatment H, with the result that particles 3 are placed in direct contact with the surface of the device. In particular, at least one particle 3 is deposited in direct simultaneous contact with the two electrodes 11, 12.

Particles 3 are retained on the surface of the electrodes, following evaporation of the liquid solution, by physisorption or chemisorption. For example, —$NH_2$ groups situated along the periphery of particles 3 can interact with atoms present on the surface of the electrodes. Moreover, functional groups can be added to the surface of the electrodes or to the particles so as to facilitate a chemical bond. These groups can be, for example, ionic groups or hydrogen atoms, or thiol, thioaryl, benzonitrile, etc. radicals.

Figure 12:
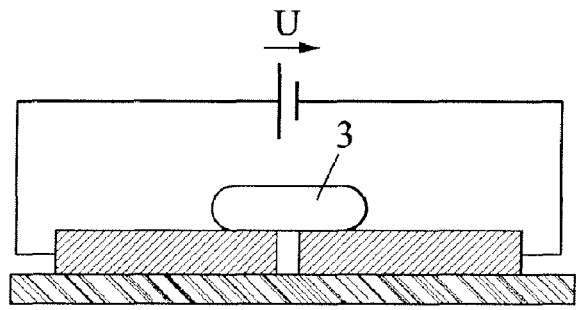
FIG. 12 illustrates schematically an advantageous step of the method according to the invention known as voltage bonding.

Preferably, following evaporation of the liquid solution, a voltage bonding step is added in the form of the application of a voltage U between the two electrodes (FIG. 12). Voltage U is adapted to the dimensions of the electrodes and the number of particles 3 expected between the two electrodes 11, 12. Voltage U is calibrated so as to reduce the access resistances between electrodes 11, 12 and particles 3, while remaining sufficiently low so that it does not destroy particles 3 or the trench separating the electrodes. Voltage U produces a modification of the interface between the particles and the electrodes. This modification changes the electrical contact between the particles and the electrodes and reduces the access resistance. It can be used to reduce, at least for one of the two electrodes, the access resistance by a factor of 10 to 1,000 or more.

In the example of the embodiment of a device according to the invention having a trench whose width is appreciably equal to 70 nm and whose linear distance is close to 20 micrometers with about 30 active particles, a voltage on the order of one or two volts can be applied for a few seconds. Depending on the particles used, the phenomenon of voltage bonding may occur at 0.5 V and may not occur before approximately 5 V. Thus, the skilled practitioner will preferably apply a voltage comprised between 0.5 V and 5V to obtain a voltage bond.

If a greater density of active particles is expected or if the trench is wider or longer, we can use values that can fall outside the range of voltages above, which is given as an example.

Figure 13:
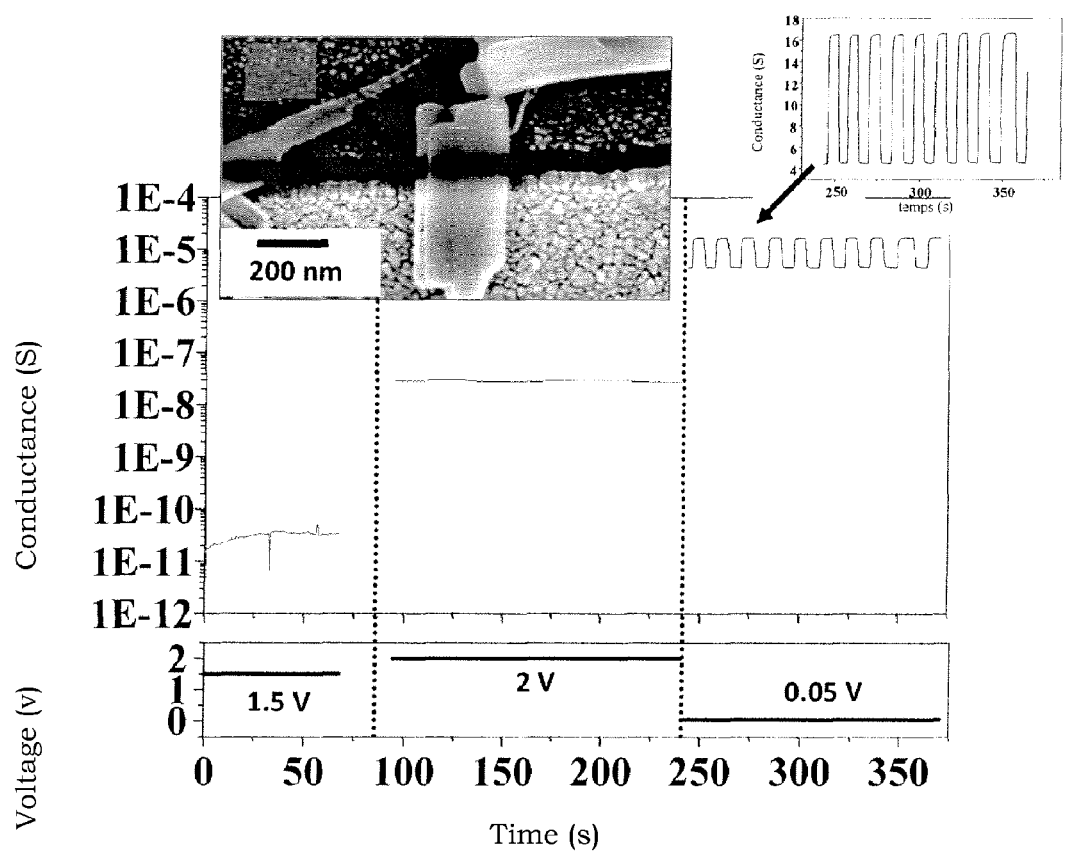
FIG. 13 is a diagram representing the conductance of a device according to the invention as a function of time, before and after the application of the voltage bonding step.

FIG. 13 illustrates the phenomenon of improving the conductance obtained through the application of voltage bonding according to this preferred embodiment of the method according to the invention. It primarily represents the results of conductance measurements (in siemens) as a function of time (in seconds) for a device according to the invention starting from time $t_0$. To conduct the test, as shown in the box on the upper left, nanometric dimension particles and gold electrodes were used. After evaporation of the liquid solution containing the particles, a conductance of less than $4.10^{-11}$ siemens was measured. A measurement voltage close to 1.5 V was used. At time t=100 seconds, a voltage appreciably equal to 2 V was imposed on the device terminals. This voltage, which implements the voltage bonding step of the method of the invention, also serves as a measurement voltage. The conductance increases and reaches a value near $4.10^{-8}$ siemens, that is a value 1,000 times greater than before voltage bonding.

Then, at a time near 250 seconds, the measurement voltage is reduced to approximately 0.05 V and cycles of illuminating and extinguishing a halogen lamp whose light is focused on the device (so-called ON/OFF cycles) are applied, similar to the test reported in association with FIG. 3. The conductance variations measured during the ON/OFF cycles are shown enlarged in the box on the upper right of FIG. 13.

The measurements shown in FIG. 13 clearly illustrate that the application of a voltage on the order of 2 V at the terminals of this prototype of the device according to the invention produces a permanent voltage bonding effect that reduces the access resistance between the electrodes and the particles.

Below we present an example of the method for depositing metal on particles according to the invention (FIGS. 14A to 14E).

Particles 3 are first suspended in solution 8 (FIG. 14A). The solution can have an ethanol base or use any other solvent that does not result in the solubilization of the particles and that has good evaporability, such as diethyl ether, water, and so on.

Solution 8 is subjected to ultrasound F for approximately five minutes to ensure good separation of the particles from one another and prevent the particles from clumping together.

This solution 8, containing the particles, is then deposited on solid support 9, for example, in the form of a drop 81 deposited on a surface of gold, nickel, or on the surface of a substrate of silicon, et cetera. (FIG. 14B).

Solution 8 is then evaporated, leaving particles 3 deposited in direct contact with solid support 9 (FIG. 14C).

This is followed by deposition P of a metallic layer and/or multilayer 144 using one or more vacuum evaporation techniques (Fig. D). It is possible to use a Joule evaporation technique, electron-beam deposition, vapor-phase physical deposition, vapor-phase chemical deposition, and so on. A side of particles 3 is in contact with solid support 9 and, therefore, cannot be covered with metal. As a result, particles 3 have a metalized zone 4 on only a single side.

The metal or metals constituting metallic layer 144 are preferably those cited above in connection with FIG. 7.

Figure 14E:
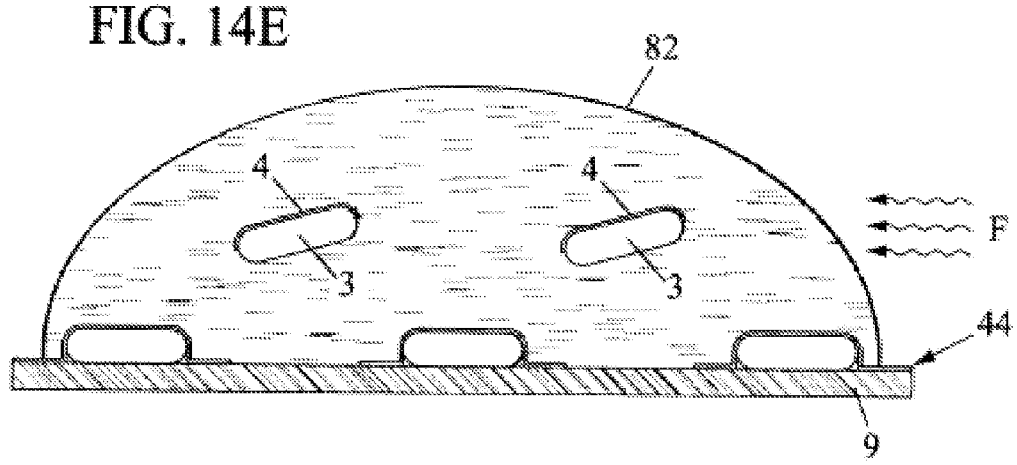

We again place solid support 9 bearing particles 3 in contact with a solution 82, which does not contain any particles, and subject these together to ultrasound F so as to remove some of the particles 3 from solid support 9 (FIG. 14E). Contact between solid support 9 bearing the particles and solution 82 can occur by depositing the solution on the solid support, for example, in the form of drops, or by immersing solid support 9 in a container holding a certain volume of solution 82 or any other appropriate solution. We thereby obtain, in suspension in solution 82, particles 3 partially covered with a metal film forming metalized zone 4.

Figure 15A:
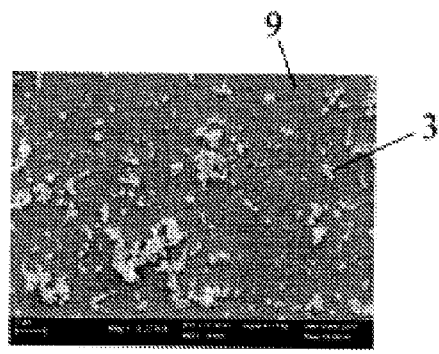
FIGS. 15A and 15B are photographs obtained with a scanning electron microscope illustrating the method for partially metalizing particles.
Figure 15B:
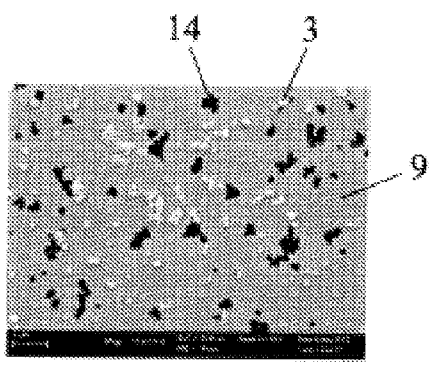

FIGS. 15A and 15B are two photographs obtained with a scanning electron microscope that represent particles 3 present on physical support 9. Photograph FIG. 15A was made before the metallization step. In FIG. 15B, particles 3 and physical support 9 have been metalized and ultrasound has been applied. We note the presence of dark spots representative of removal zones 14, where partially metalized particles have been removed and placed back in suspension following the application of ultrasound.

Particles 3 bearing metalized zone 4 can be used directly in a device according to the invention for the conducting and/or optical properties of the metal film composing the metalized zone.

In particular, by adding functional groups, through treatment or grafting, to non-metalized zones 5 of the particles, to metalized zones 4 of particles 3 and/or to electrodes 11, 12, it is possible to force either a majority of particles 3 to have their metalized zone 4 in contact with electrodes 11, 12, forming a metal-metal contact, or a majority of particles 3 to have their non-metalized zone 5 in contact with electrodes 11, 12, forming a metal-organic contact.

For example, we can functionalize the electrodes in such a way that they react chemically, preferably with the metalized zones or with the non-metalized zones, or with a functional group present on the surface of those said zones. This can be done through the application of an oxygen plasma process or a hydrogen plasma, or by grafting functional groups to the surface of the electrodes. For example, to form a metal-metal contact, it is advantageous to deposit organic groups, for example, thioaryl, dithioaryl, benzonitrile, known for their affinity for certain metallic surfaces (gold, nickel, etc.) on the surface of the electrodes. Thus, electrodes 11, 12 form a preferred contact with metalized zones 4 of the particles.

Conversely, or additionally, it can be advantageous to functionalize the particles.

In a first case, a first functionalization treatment of particles 3 in solution takes place prior to the metallization step. Then, after metallization, the metal layer covers the functional groups for metalized zone 4. The functional groups, favoring or disfavoring a bond with the electrodes, are no longer present except on non-metalized zones 5. For example, to form an organic-metal contact, we might consider attaching functional groups to the substituents of ligands G of the particles, on the non-metalized side. For example, in the case of particles based on 4-amino-1,2,4-triazole, the aminated substituent can be coupled with an aldehyde function to graft groups such as thioaryl, benzonitrile, which are known for their affinity with certain metallic surfaces (gold, nickel, etc.).

Alternatively, or additionally, it is possible, in a second case, to functionalize the metalized zones. Thus, we preferably undertake a second functionalization treatment of the particles following the metallization step and before removing the particles from the solid support. Thus, the functionalization treatment is applied only to the metalized zone. After removal of particles 3, the functional groups added during the second functionalization treatment are present solely on metalized zone 4 and not on non-metalized zone 5.

It can be advantageous to functionalize the non-metalized zones with a first functional group, the metalized zones with a second functional group, and the electrodes with a third functional group.

The choice of different functional groups, the nature of the particles, and the nature of the metals used can advantageously allow us to predetermine the way in which the metalized zones will be positioned relative to the electrodes for a majority of the particles. Thus, we can determine whether the metalized zone will have an impact principally on the optical or chemical properties of the device, influencing the interaction of the device with external stimuli, or on electrical properties, influencing the device's electrical contact and resistance.

However, if metalized zone 4 present on particles 3 has at least one magnetic or magnetizable metallic layer, it will be possible to employ, in the method for realizing devices according to the invention, an advantageous step of organizing the particles, described below in association with FIGS. 16A to 16D.

For this advantageous step, electrodes 11, 12 both contain an electrode core 111, 121 of a magnetic or magnetizable material. The electrode cores can, for example, be of nickel or iron or another magnetizable material. Either or both of the two electrodes 11,12 can be covered with a surface metallic layer 112, 122 of a metal that differs from electrode core 111, 121, depending on the type of device we wish to realize.

According to the advantageous method of the invention, prior to the deposition of drop 6 containing particle(s) 3, electrodes 11, 12 are magnetized.

Figure 16A:
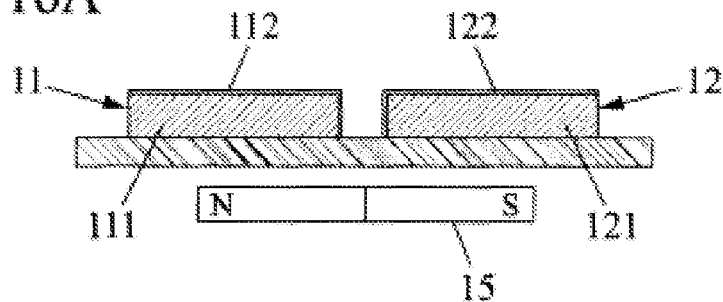
FIGS. 16A to 16D illustrate schematically an advantageous step of the method according to the invention in which the particles are positioned near the trench.
Figure 16B:
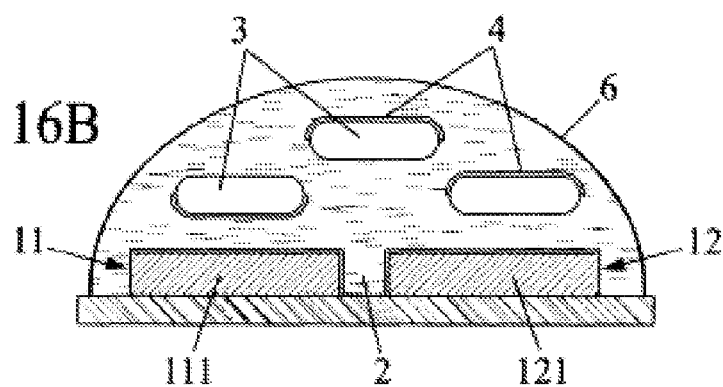

For this, it is preferable to subject electrodes 11, 12 to a magnetic field (FIG. 16A). For example, it is possible to bring the electrodes near a low-intensity permanent magnet 15.

We then deposit drop 6 of the liquid solution holding particles 3 in suspension (FIG. 16B) on the device and, in particular, above electrodes 11, 12. Particles 3 are partially covered with a metalized zone 4 at least one layer of which is of a magnetic or magnetizable material such as nickel.

Finally, in a third step, automatic organization of particles 3 takes place near trench 2 separating the electrodes.

Figure 16C:
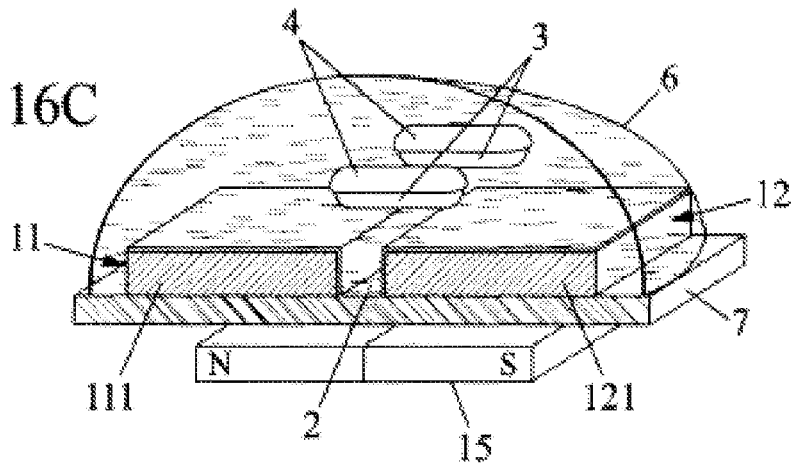

For this, a preferred method is to subject metalized zones 4 of particles 3 in suspension to an imposed magnetic field (FIG. 16C). The imposed magnetic field can be obtained by presenting a permanent magnet 15 beneath substrate 7, which supports electrodes 11, 12 and drop 6 of the liquid solution. As shown in the three-dimensional view in FIG. 15C, particles 3, maneuvered by permanent magnet 15, the magnetized electrodes, and magnetizable or magnetic metalized zone 4 covering them, are preferably positioned near trench 2. In the example in FIG. 16C, particles 3 are advantageously positioned with their metalized zone positioned opposite the electrodes. It is also possible, as indicated above, to introduce functional groups on the particles or on the electrodes in such a way that the metalized zones are preferably attracted by the electrodes (FIG. 16C).

In effect, magnet 15 creates an imposed magnetic field on the surface of electrodes 11, 12 and substrate 7. Electrode cores 111, 121, magnetized or magnetizable, modify the local magnetic field by increasing it with respect to the imposed magnetic field. On the other hand, at trench 2, the magnetic field is close to the value given by the imposed magnetic field alone. As a result, the cumulative action of the imposed magnetic field and electrode cores 111, 121 leads to the formation of a magnetic field gradient between the electrodes, at trench 2. The magnetic field gradient attracts metalized zones 4 of particles 3.

Figure 16D:
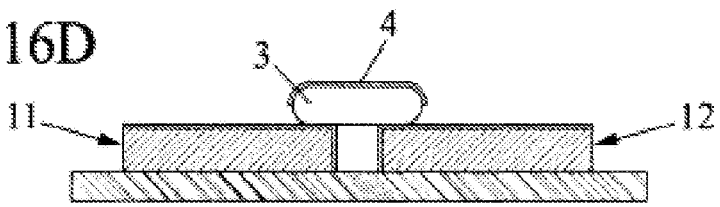
Figure 16C:
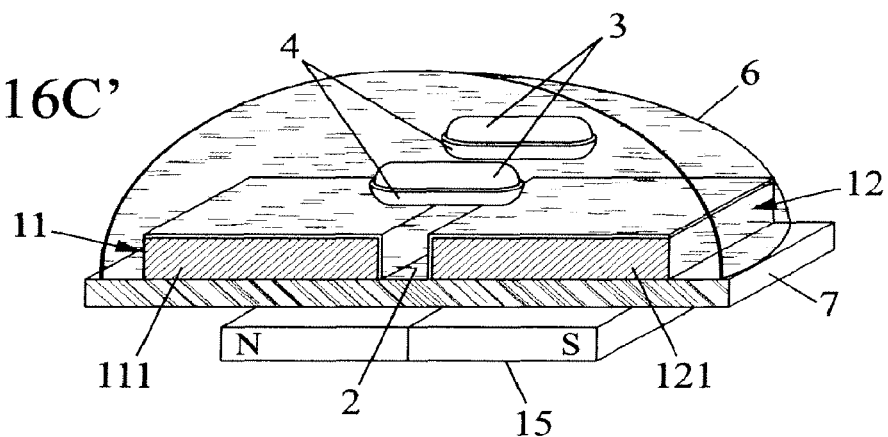
Figure 16D:
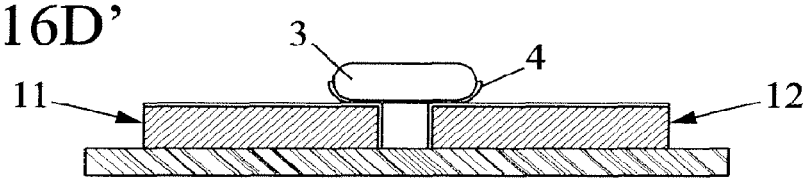

The liquid solution is then evaporated (FIG. 16D). A very large proportion of the particles initially present in solution are thus deposited in direct simultaneous contact with the two electrodes 11, 12. In the example in FIG. 16D, particles 3 are advantageously positioned with their non-metalized zone in contact with the electrodes. It is also possible, as indicated above, to introduce functional groups on the particles or on the electrodes in such a way that the electrodes are preferably in contact with the metalized zones of the particles (FIG. 16D').

In this example, the magnetization of electrode cores 111, 121 has taken place before deposition of the drop of solution containing the particles in suspension. Alternatively, magnetization of electrode cores 111, 121 can occur after the drop of solution has been deposited. In this case, the steps of particle magnetization and organization are simultaneous.

Figure 17:
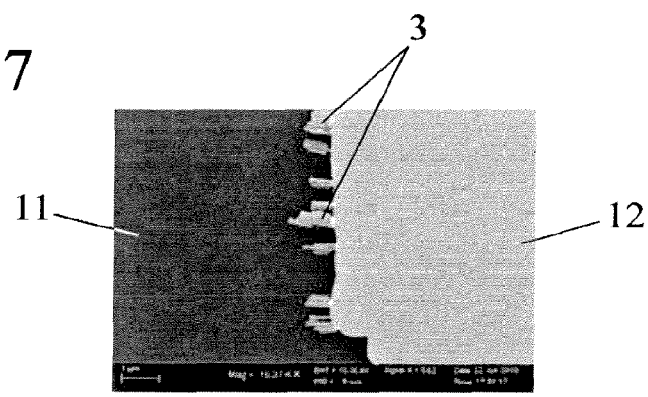
FIG. 17 is a photograph obtained with a scanning electron microscope of a device obtained using this advantageous step.

FIG. 17 is an image obtained with a scanning electron microscope of a device obtained by application of the advantageous method illustrated in FIGS. 16A to 16D. There, we observe two electrodes 11, 12 and particles 3 aligned at the interface between the two electrodes. This interface between the two electrodes reveals the position of the trench separating the two electrodes. We can also clearly see that particles 3 are in direct contact with each of two electrodes 11, 12.

Figure 18:
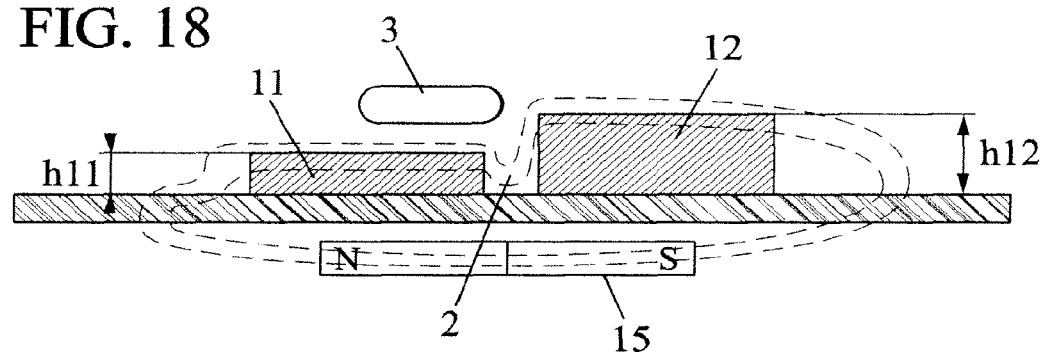
FIG. 18 represents schematically a variant of this advantageous step in which the two electrodes have different heights.

When applying the automatic particle organization step, it can be advantageous, as shown in FIG. 18, for the electrodes to have different heights h. A first 11 of two electrodes can be lower than the second 12 of two electrodes. Thus, following the magnetization of electrodes 11, 12 and during application of the imposed magnetic field, the local magnetic field gradient at the trench induces particles 3 to position themselves in contact with the second of the two electrodes but with a greater proportion situated above first electrode 11 and in contact with it.

There are many fields of application for the devices according to the different embodiments of the invention, notably in the field of photovoltaics, in the emerging field of molecular electronics, and more broadly in the field of so-called "intelligent" materials, namely those that respond to an external stimulus (temperature, pressure, light). For example, we can select the particles of the device according to the invention so that they have an electronic spin-state transition temperature chosen to correspond to a critical temperature. This critical temperature can be indicative of a fatigue temperature of the device or a temperature beyond which greater photovoltaic power is required, and so on. Such a photosensitive device can be used to make a photovoltaic device that, through the effect of reheating, would change its electronic spin state and, thus, for example, its color and, thus, its absorption properties. In this way the device is "self-regulated," that is, it is self-limiting to avoid, for example, excess heating.

The device according to the invention has been principally described with particles based on a compound complying with chemical formula {1}. We anticipate obtaining comparable results with a device comprising a particle that does not comply with chemical formula {1} but that displays a temperature-controlled electronic spin-state transition.

The invention claimed is:

1. An electrical device having two electrodes separated from one another, wherein at least one temperature controlled electronic spin-state transition particle is in direct contact with each of the two electrodes, the particle being of an ionic type and having a transition metal bearing a cationic charge, the particle having a conductivity that varies as a function of the intensity of incident light;

wherein an electronic spin-state transition in said particle, due to controlled temperature change, causes a variation of conductivity in said particle; and wherein, at least in one electronic spin-state, said particle has a conductivity depending on the intensity of an incident light, and said controlled temperature change modifies the conductivity response to incident light intensity.

2. The device according to claim 1, wherein the particle is based on a compound satisfying the formula:

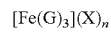

$$[Fe(G)_3](X)_n$$

where G is a 1,2,4-triazole ligand with a substituent R on the nitrogen in position 4, indicated as R-Trz;

X represents at least one anion;

and n is calculated in such a way that electroneutrality of the formula is respected.

3. The device according to claim 2, wherein substituent R is selected from among the group consisting of hydrogen and $H_2N-$, $R_1-$, $HR_1N-$, and $R_1R_2N-$ compounds, where $R_1$ and $R_2$ are alkyl radicals.

4. The device according to claim 1, wherein the particle is a nanometric particle at least one of whose dimensions is between 30 nm and 700 nm.

5. The device according to claim 4, wherein the particle is covered dissymmetrically with a layer of metal.

6. The device according to claim 1, suitable for functioning as a photoconductive device wherein the two electrodes are covered by a same metal.

7. The device according to claim 1, suitable for functioning as a photovoltaic device, wherein one of the two electrodes is covered by a first metal and the other of the two electrodes is covered by a second metal that is different from the first metal.

8. The device according to claim 5, wherein the metal is selected from the group consisting of gold, nickel, and a multilayer gold-nickel structure.

9. The device according to claim 1, wherein the electrodes are separated by a trench imposing a distance that is less than or appreciably equal to 100 nanometers between the two electrodes.

10. The device according to claim 1, wherein the electrodes are separated by a trench and opposite one another along a linear distance comprised between a few micrometers and a few meters.

11. The device according to claim 1, wherein the heights of the two electrodes, defined perpendicularly to a principal plane shared by the two electrodes, are different from one another.

12. The device according to claim 1, suitable for functioning as a photoelectric device and suitable for changing photoelectric properties based on a predetermined temperature, wherein the electronic spin-state transition particles are chosen from among the temperature controlled electronic spin-state transition particles whose electronic spin-state transition occurs near the specified temperature.

13. A method for manufacturing the device according to claim 1, comprising the following successive steps:

a) supply of two metallic electrodes on a substrate, separated from one another by a trench;

b) deposition of at least one temperature controlled electronic spin-state transition particle so that it is in direct simultaneous contact with both electrodes, in the form of the localized application of a liquid solution containing the particle in ionic solution, followed by evaporation of the liquid solution, leaving the particle on the device, the particle being of an ionic type containing a transition metal that bears a cationic charge, and having a conductivity varying as a function of the intensity of incident light, an electronic spin-state transition in said particle, due to controlled temperature change, causing a variation of conductivity in said particle, and at least in one electronic spin-state, said particle having a conductivity depending on the intensity of an incident light, and said controlled temperature change modifying the conductivity response to incident light intensity, the electroneutrality of the liquid solution being assured by an anionic counter-ion.

14. The method according to claim 13 incorporating, after step b), an application of a voltage between the two electrodes that is sufficiently high to reduce the access resistances between the electrodes and the particle but sufficiently low to avoid destruction of the particle or the trench separating the electrodes.

15. The method according to claim 14 wherein the applied voltage is between 0.5 and 5 volts.

16. The method according to claim 13 wherein the electrodes have at least one magnetizable metal and wherein it can be incorporated prior to step b):

a step during which the particle to be deposited in step b) is partially covered with a layer of metal having magnetic properties;

and a step involving magnetization of the electrodes by way of the application of a magnetic field at the two electrodes, and wherein step b) includes, between deposition of the liquid solution and its evaporation, a step involving organization of the particles at the trench separating the electrodes by means of the application of a magnetic field at the two electrodes.

17. An electrical device having two electrodes separated from one another, wherein at least one temperature controlled electronic spin-state transition particle is in direct contact with each of the two electrodes, the particle being of an ionic type and having a transition metal bearing a cationic charge, the particle having a conductivity that varies as a function of the intensity of incident light;

wherein the particle is based on a compound satisfying the formula:

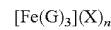

where G is a 1,2,4-triazole ligand with a substituent R on the nitrogen in position 4, indicated as R-Trz;

X represents at least one anion;

and n is calculated in such a way that electroneutrality of the formula is respected.

* * * * *